(12) United States Patent
Akram

(10) Patent No.: US 7,368,812 B2
(45) Date of Patent: May 6, 2008

(54) INTERPOSERS FOR CHIP-SCALE PACKAGES AND INTERMEDIATES THEREOF

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 11/249,540

(22) Filed: Oct. 13, 2005

(65) Prior Publication Data

US 2006/0043477 A1 Mar. 2, 2006

Related U.S. Application Data

(62) Division of application No. 10/292,155, filed on Nov. 11, 2002.

(51) Int. Cl.
*H01L 23/02* (2006.01)

(52) U.S. Cl. .................. 257/686; 257/700; 257/723; 257/E23.067; 257/E23.174

(58) Field of Classification Search ............ 257/686, 257/698, 700, 778, 723, 724, E23.067, E23.06, 257/E23.174

See application file for complete search history.

(56) References Cited

U.S. PATENT DOCUMENTS

| | | | |
|---|---|---|---|
| 4,830,264 A | 5/1989 | Bitaillou |
| 5,185,295 A | 2/1993 | Goto et al. |
| 5,229,647 A | 7/1993 | Gnadinger |
| 5,258,648 A | 11/1993 | Lin |
| 5,291,438 A | 3/1994 | Witek et al. |
| 5,418,687 A | 5/1995 | Chen |
| 5,440,241 A | 8/1995 | King et al. |
| 5,506,383 A | 4/1996 | Chen |
| 5,682,062 A | 10/1997 | Gaul |
| 5,685,885 A | 11/1997 | Khandros et al. |
| 5,742,100 A | 4/1998 | Schroeder et al. |
| 5,767,575 A | 6/1998 | Lan et al. |
| 5,870,289 A | 2/1999 | Tokuda et al. |
| 5,892,288 A | 4/1999 | Muraki et al. |
| 5,940,679 A | 8/1999 | Tomura et al. |
| 5,946,555 A | 8/1999 | Crumly et al. |
| 5,949,140 A | 9/1999 | Nishi et al. |
| 5,973,396 A | 10/1999 | Farnworth |
| 5,990,546 A | 11/1999 | Igarashi et al. |
| 6,004,867 A | 12/1999 | Kim et al. |
| 6,037,665 A | 3/2000 | Miyazaki |

(Continued)

FOREIGN PATENT DOCUMENTS

JP 63-157430 6/1988

*Primary Examiner*—Thanhha S. Pham
(74) *Attorney, Agent, or Firm*—TraskBritt

(57) ABSTRACT

A carrier substrate, or interposer, for use in a chip-scale package includes a material, such as a semiconductive material, that has a coefficient of thermal expansion that is the same or similar to that of the semiconductor device to be secured thereto. The interposer may also include a rerouting element laminated over the remainder of the interposer and including one or more dielectric layers, as well as a conductive layer for rerouting the bond pad locations of a semiconductor device with which the interposer is to be assembled. The interposers may be fabricated on a "wafer scale." Accordingly, a semiconductor device assembly may include a first, semiconductor device-carrying substrate and a second, interposer-comprising substrate. Regions of the second substrate that comprise the boundaries between adjacent interposers may be thinner than other regions of the second substrate, including the regions from which the interposers are formed.

14 Claims, 9 Drawing Sheets

U.S. PATENT DOCUMENTS

| | | |
|---|---|---|
| 6,064,114 A | 5/2000 | Higgins, III |
| 6,114,187 A | 9/2000 | Hayes |
| 6,197,613 B1 | 3/2001 | Kung et al. |
| 6,228,687 B1 | 5/2001 | Akram et al. |
| 6,291,272 B1 | 9/2001 | Giri et al. |
| 6,294,405 B1 | 9/2001 | Higgins, III |
| 6,297,553 B1 | 10/2001 | Horiuchi et al. |
| 6,392,296 B1 | 5/2002 | Ahn et al. |
| 6,440,771 B1 | 8/2002 | Pierce |
| 6,458,623 B1 | 10/2002 | Goldmann et al. |
| 6,809,421 B1 | 10/2004 | Hayasaka et al. |
| 6,955,870 B2 | 10/2005 | Kohno et al. |
| 2003/0038378 A1* | 2/2003 | Jacobs ........................ 257/783 |

* cited by examiner

INTERPOSERS FOR CHIP-SCALE PACKAGES AND INTERMEDIATES THEREOF

CROSS-REFERENCE TO RELATED APPLICATION

This application is a divisional of application Ser. No. 10/292,155, filed Nov. 11, 2002, pending.

BACKGROUND OF THE INVENTION

1. Field of the Invention

The present invention relates to carrier substrates, or interposers, for use in chip-scale packages and to chip-scale packages including such carrier substrates. Particularly, the present invention relates to silicon carrier substrates. Methods of fabricating chip-scale packages are also within the scope of the present invention.

2. State of the Art

In conventional semiconductor device fabrication processes, a number of distinct semiconductor devices, such as memory chips or microprocessors, are fabricated on a semiconductor substrate, such as a silicon wafer. After the desired structures, circuitry, and other features of each of the semiconductor devices have been fabricated upon the semiconductor substrate, the substrate is typically singulated to separate the individual semiconductor devices from one another.

Various post-fabrication processes, such as testing the circuits of each of the semiconductor devices and burn-in processes, may be employed either prior to or following singulation of the semiconductor substrate. These post-fabrication processes may be employed to impart the semiconductor devices with their intended functionality and to determine whether or not each of the individual semiconductor devices meets quality control specifications.

The individual semiconductor devices may then be packaged. Along with the trend in the semiconductor industry to decrease semiconductor device sizes and increase the densities of semiconductor device features, package sizes are also ever-decreasing. One type of semiconductor device package, the so-called "chip-scale package" or "chip-sized package" ("CSP"), consumes about the same amount of real estate upon a carrier substrate as the bare semiconductor device itself. Such chip-scale packages typically include a carrier substrate, or interposer, having roughly the same surface area as the semiconductor device itself. As the interposer of such a chip-scale package is small, electrical connections between the semiconductor device and the carrier substrate are often made by flip-chip type bonds or tape-automated bonding ("TAB"). Due to the typical use of a carrier substrate that has a different coefficient of thermal expansion than that of the semiconductor substrate of the semiconductor device, these types of bonds may fail during operation of the semiconductor device.

In view of the potential for failure of the flip-chip or TAB electrical connections in chip-scale packages, chip-scale packages that include more flexible electrical connections, such as wire bonds, were developed. An exemplary chip-scale package that includes such flexible electrical connections is disclosed in U.S. Pat. No. 5,685,885 (hereinafter "the '885 Patent"), issued to Khandros et al. on Nov. 11, 1997. The chip-scale package of the '885 Patent may be assembled by orienting and disposing a sheet of interposer material over a wafer including a plurality of semiconductor devices thereon. The bond pads of the semiconductor devices may then be wire-bonded or otherwise flexibly bonded to corresponding contacts of the interposer. The wafer and interposer sheet may then be simultaneously singulated to separate individual semiconductor device packages from each other. The method and devices of the '885 Patent are, however, somewhat undesirable. In addition to including a semiconductor device and a carrier substrate therefor, the package of the '885 Patent includes another flexible, sheet-like dielectric interposer configured to be positioned between and aligned with both the semiconductor device and the carrier substrate. The double alignment of this additional interposer increases the likelihood that the resulting semiconductor device package will fail.

Following packaging, the packaged semiconductor devices may be retested or otherwise processed to ensure that no damage occurred during packaging. The testing of individual, packaged semiconductor devices is, however, somewhat undesirable since each package must be individually aligned with such testing or probing equipment.

Accordingly, there is a need for a semiconductor packaging process that facilitates testing, probing, and burn-in of semiconductor devices without requiring the alignment of individual semiconductor devices with probes or contacts of testing equipment and by which a plurality of reliable chip-scale packages may be substantially simultaneously assembled. An efficient chip-scale packaging process with a reduced incidence of semiconductor device failure is also needed. There is a further need for chip-scale packaged semiconductor devices that withstand repeated exposure to the operating conditions of the semiconductor devices thereof.

BRIEF SUMMARY OF THE INVENTION

A carrier substrate according to the present invention, which is also referred to herein as an interposer or simply as a carrier, is comprised of a semiconductor material and includes apertures defined substantially through the semiconductor material. The apertures of the carrier substrate are alignable with or may otherwise be positioned to communicate with corresponding bond pads of a semiconductor device to be secured to the carrier substrate. The apertures of the substrate are lined with electrically insulative material. Any of the exposed surfaces of the carrier substrate may also be covered with insulative material.

Conductive material may be disposed within and substantially fill the apertures so as to facilitate the transmission of signals to and from the bond pads of the semiconductor device through the carrier substrate. Alternatively, the insulator-lined apertures of the carrier substrate may be lined with conductive material by known metallization processes, such that conductive structures extending through the apertures each include a hollow portion. The hollow portion may be subsequently filled with a conductive bump material, such as solder. When the apertures are substantially filled with conductive material, an aperture and the conductive material therein collectively define an electrically conductive via, which is also referred to herein as a via for simplicity, through the carrier substrate.

The carrier substrate may also include conductive traces extending substantially laterally from selected ones of the electrically conductive vias. Preferably, each laterally extending conductive trace is carried by the carrier substrate proximate a surface opposite the surface to which a semiconductor device may be secured, which opposite surface is also referred to herein as a back side surface or simply as a back side of the carrier substrate. Such laterally extending conductive traces facilitate reconfiguration by the carrier substrate of the "footprint" formed by bond pads on the surface of the semiconductor device.

Contacts, which communicate with corresponding vias, may be disposed proximate to and are preferably exposed at the back side of the carrier substrate. If the carrier substrate includes any conductive traces that extend from the electrically conductive vias, a contact may be disposed proximate an end of a conductive trace, opposite the via from which the conductive trace extends and with which the conductive trace communicates. Alternatively, a contact may be positioned along the length of a conductive trace.

A conductive bump, such as a solder bump or a solder ball, may be placed adjacent each contact. Alternatively, if the apertures of the carrier substrate were lined with conductive material, a conductive bump may be placed substantially over selected apertures and permitted to substantially fill any remaining hollow portions of the apertures by capillary action or wicking.

The carrier substrate may also include insulative material on the back side thereof. The insulative material may be grown or deposited on the back side of the carrier substrate. If the back side of the carrier substrate has insulative material thereon, the contacts or conductive bumps are preferably exposed through the insulative material.

When the carrier substrate is employed in a chip-scale package, a semiconductor device is invertedly positioned over the carrier substrate such that bond pads on the active surface of the semiconductor device substantially align with corresponding vias of the carrier substrate. Thus, the vias through the carrier substrate communicate electrical signals to and from the corresponding bond pads of the semiconductor device. The carrier substrate and the semiconductor device may be secured to one another, at least in part, by bonding the conductive material of the vias to the material of the bond pads.

Alternatively, or in combination with bonds between the conductive material of the carrier substrate and bond pads of the semiconductor device, an intermediate layer may be disposed between the semiconductor device and the carrier substrate to secure the semiconductor device to the carrier substrate. Preferably, such an intermediate layer comprises an adhesive material securable to both the active surface of the semiconductor device and a surface of the carrier substrate.

In a preferred embodiment of the method of the present invention, apertures are defined through a first semiconductor wafer, such as a silicon wafer, which is also referred to herein as a substrate wafer or as a carrier substrate. The apertures through the substrate wafer may be defined by known processes, such as by laser drilling or by masking and etching. Preferably, the locations of the apertures of the carrier substrate or substrate wafer correspond substantially to bond pad locations of semiconductor devices fabricated on a second wafer including a plurality of semiconductor devices, which wafer is also referred to herein as a semiconductor device wafer.

The substrate wafer is aligned with the semiconductor device wafer so that corresponding apertures of the substrate wafer and bond pads of the semiconductor device wafer are substantially aligned with one another. A polymeric material or an adhesive material may be disposed on either an active surface of the semiconductor device wafer or on a surface of the substrate wafer to be positioned adjacent the semiconductor device wafer. The semiconductor device wafer and the substrate wafer are aligned and positioned adjacent one another.

A layer of insulative material may be grown or formed on any exposed surfaces of the substrate wafer, including the surfaces of the apertures formed through the substrate wafer, by known processes, such as by thermal oxidation techniques or chemical vapor deposition techniques. The insulative material may be disposed on the substrate wafer either prior to or after assembly thereof with the semiconductor device wafer.

Conductive material may be disposed in each of the apertures to define vias through the substrate wafer. As conductive material is disposed within each of the apertures, the conductive material and a material of the bond pad exposed to the aperture may diffuse and thereby at least partially secure the semiconductor device wafer and the substrate wafer to one another.

Any laterally extending conductive traces may be fabricated on the back side of the substrate wafer. Known techniques, such as metallization processes, masking processes, and etching processes, may be employed to fabricate these conductive traces.

Contact pads comprising under-bump metallurgy ("UBM") or ball-limiting metallurgy ("BLM"), which are referred to herein as contacts for simplicity, may be fabricated on the back side of the substrate wafer. Preferably, each of these contacts corresponds to and communicates with a via of the carrier substrate or substrate wafer. The contacts may be fabricated by known processes, such as by known metallization, masking, and etching processes. A conductive bump, such as a solder bump or a solder ball, or other conductive structure (e.g., a pillar or column of electrically conductive material) may be disposed on each of the contacts by known processes.

An assembly that includes the semiconductor device wafer and the substrate wafer may be singulated by known processes. Upon singulation of individual semiconductor devices from the semiconductor device wafer and the substantially simultaneous singulation of the substrate wafer, individual chip-scale packages are separated from one another.

Other features and advantages of the present invention will become apparent to those of skill in the art through a consideration of the ensuing description, the accompanying drawings, and the appended claims.

DETAILED DESCRIPTION OF THE INVENTION

Figure 1:
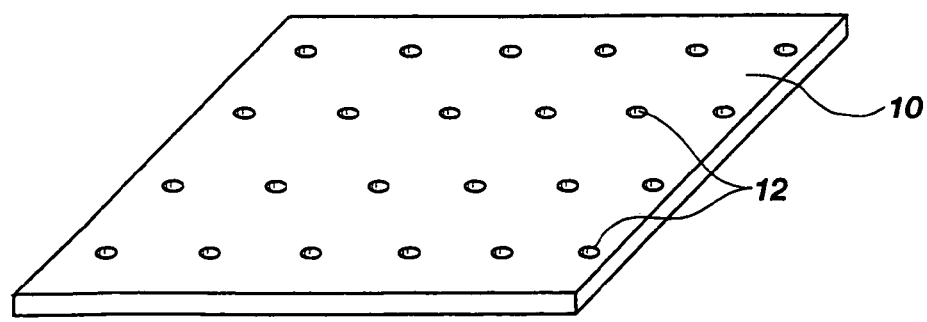
FIG. 1 is a perspective view of a carrier substrate according to the present invention.

With reference to FIG. 1, a carrier substrate 10, which is also referred to herein as a semiconductor substrate or simply as a carrier, is illustrated. Carrier substrate 10 is a substantially planar structure, such as a wafer, that may be formed from a semiconductor material, such as silicon, gallium arsenide, or indium phosphide.

Carrier substrate 10 includes an array of apertures 12 defined therethrough. Each aperture 12 is lined with a layer 13 comprising an electrically insulative material. Preferably, apertures 12 are located in positions that correspond substantially to the positions of bond pads 16 (see FIG. 3) of one or more semiconductor devices 14 to be assembled with carrier substrate 10.

Figure 3:
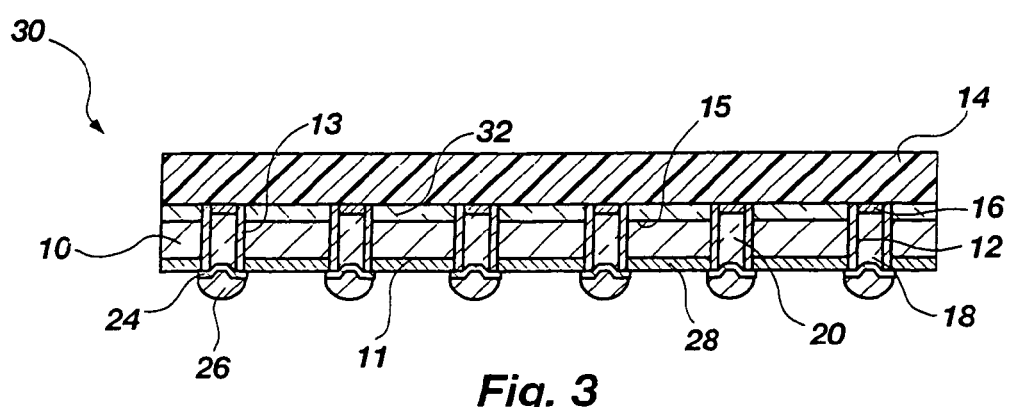
FIG. 3 is a cross-section taken along line 3-3 of FIG. 2.

A chip-scale package 30 that includes carrier substrate 10 and an associated semiconductor device 14 is shown in FIG. 3. As depicted, carrier substrate 10 includes a quantity of conductive material 18 in each aperture 12. The conductive material 18 within each aperture 12 defines an electrically conductive via 20 that extends substantially through carrier substrate 10, through which electrical signals may be communicated to or from a corresponding bond pad 16 of semiconductor device 14.

Figure 12:
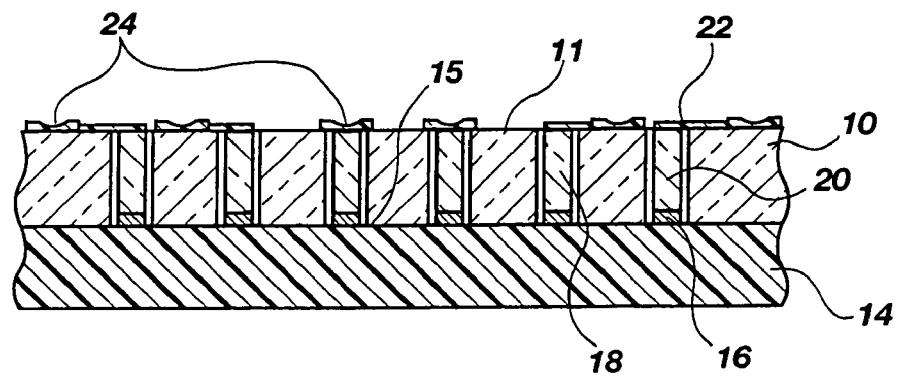
FIG. 12 is a schematic cross-sectional representation of the fabrication of laterally extending conductive traces and their corresponding contacts in communication with selected ones of the electrically conductive vias of FIG. 10.

As shown in FIG. 12, carrier substrate 10 may also include conductive traces 22 that extend laterally across a surface (e.g., back side 11) thereof from vias 20 to other locations on the surface of carrier substrate 10. As illustrated, conductive traces 22 are carried upon or proximate a back side 11 of carrier substrate 10. Alternatively, conductive traces 22 may extend internally through carrier substrate 10.

Contacts 24, such as the ball-limiting metallurgy or under-bump metallurgy structures known in the art, may communicate with vias 20 and be located on or proximate back side 11 of carrier substrate 10. If carrier substrate 10 includes any laterally extending conductive traces 22, contacts 24 may be placed on or in communication with such conductive traces 22. Referring again to FIG. 3, contacts 24 that communicate with vias 20 that do not include laterally extending conductive traces 22 may be placed directly on such vias 20. A conductive structure 26, such as a bump, ball, column, or pillar of solder or another conductive material (e.g., a z-axis conductive elastomer), may be placed adjacent each contact 24.

Carrier substrate 10 may also include insulative material on back side 11. Insulative material may form a layer 28 that substantially covers back side 11. The presence of a layer 28 comprising insulative material on back side 11 is especially preferred if carrier substrate 10 includes any conductive traces 22 that are carried upon or exposed at back side 11. If carrier substrate 10 includes a layer 28 of insulative material on back side 11, then one or more of vias 20, contacts 24, or conductive structures 26, if present, are preferably exposed through layer 28.

Figure 2:
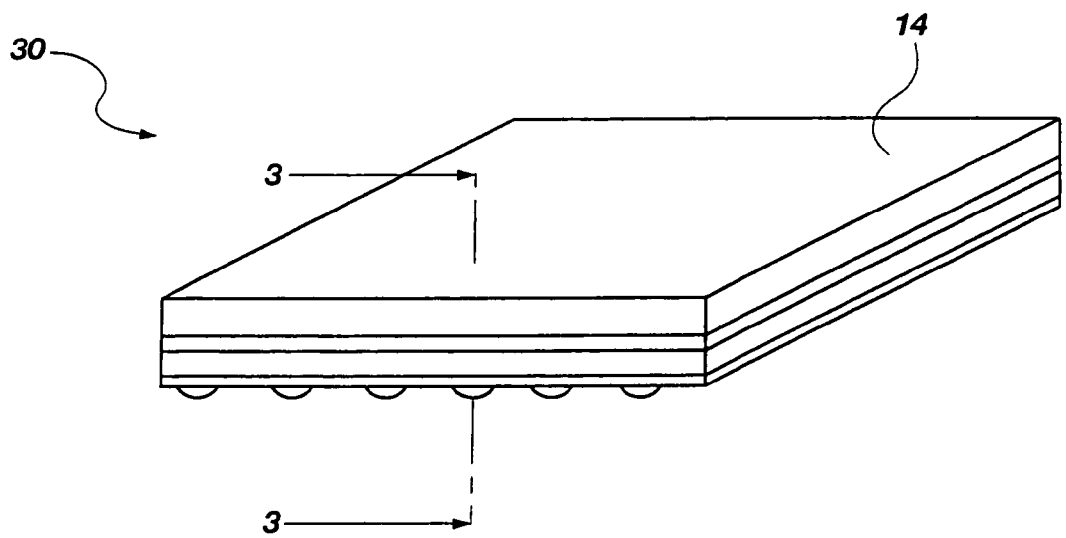
FIG. 2 is a perspective view of a chip-scale package according to the present invention.

FIGS. 2 and 3 illustrate a chip-scale package 30 that includes a semiconductor device 14, shown in an inverted orientation, positioned adjacent to carrier substrate 10. As illustrated, semiconductor device 14 is a flip-chip type semiconductor device that includes bond pads 16 disposed in an array over an active surface 15 thereof. Bond pads 16 of semiconductor device 14 and their corresponding vias 20 of carrier substrate 10 are substantially aligned, thereby facilitating communication between each bond pad 16 and its corresponding via 20.

As shown in FIGS. 2 and 3, an intermediate layer 32 may be disposed between semiconductor device 14 and carrier substrate 10. If chip-scale package 30 includes such an intermediate layer 32, bond pads 16 and their corresponding vias 20 are preferably exposed or otherwise communicate with one another through intermediate layer 32.

Figure 4:
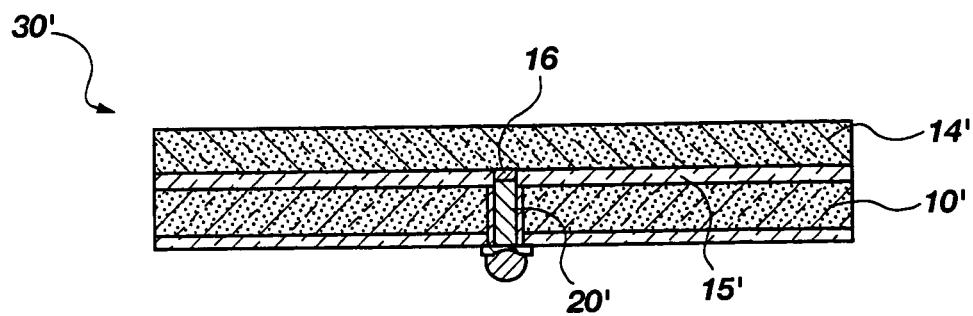
FIG. 4 is a cross-sectional representation of a variation of the chip-scale package shown in FIGS. 2 and 3.

An alternative embodiment of chip-scale package 30' incorporating teachings of the present invention is shown in FIG. 4. As illustrated, chip-scale package 30' includes a leads-over-chip (LOC) type semiconductor device 14', which includes bond pads 16 arranged along one or more lines located at or near the center of active surface 15' of semiconductor device 14'. Bond pads 16 of semiconductor device 14' and their corresponding vias 20' of a complementarily configured carrier substrate 10' are substantially aligned upon assembly of semiconductor device 14' with carrier substrate 10'.

Turning now to FIGS. 5-17, an exemplary method for fabricating chip-scale packages 30 in accordance with teachings of the present invention is illustrated. The features of carrier substrate 10 and a chip-scale package 30 including carrier substrate 10 are also described in greater detail with reference to FIGS. 5-17.

Figure 5:
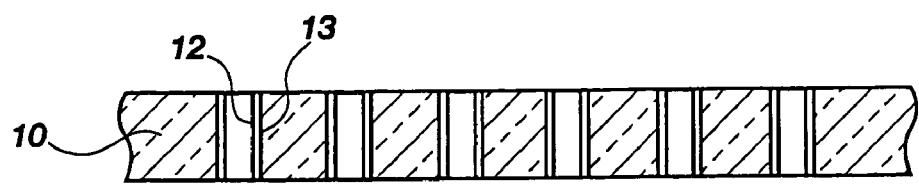
FIG. 5 is a schematic cross-sectional representation of a carrier substrate having apertures formed therethrough in accordance with the method of the present invention.

FIG. 5 illustrates a carrier substrate 10 including an array of apertures 12. Carrier substrate 10 may be fabricated from a full or partial wafer formed from a semiconductor material, such as silicon, gallium arsenide, or indium phosphide, or from another suitable substrate, such as a silicon-on-glass ("SOG"), silicon-on-ceramic ("SOC"), silicon-on-sapphire ("SOS"), or other silicon-on-insulator ("SOI") type substrate. Carrier substrate 10 may comprise a substantially chip-sized structure or may be part of a larger structure, such as a wafer 36 (see FIG. 9).

Apertures 12 may be defined through carrier substrate 10 by known techniques, such as by known laser machining processes, which are also referred to herein as laser drilling techniques, or by known patterning processes (e.g., masking and etching). Each aperture 12 preferably extends substantially through carrier substrate 10. The location of each aperture 12 preferably corresponds substantially to a location of a bond pad 16 (see FIG. 6) of a semiconductor device 14 to be assembled with carrier substrate 10.

Apertures 12 are lined with a layer 13 that includes electrically insulative material. Layer 13 may be formed by known processes, such as by use of known oxidation techniques to oxidize the semiconductor material at the surfaces of apertures 12.

Figure 6:
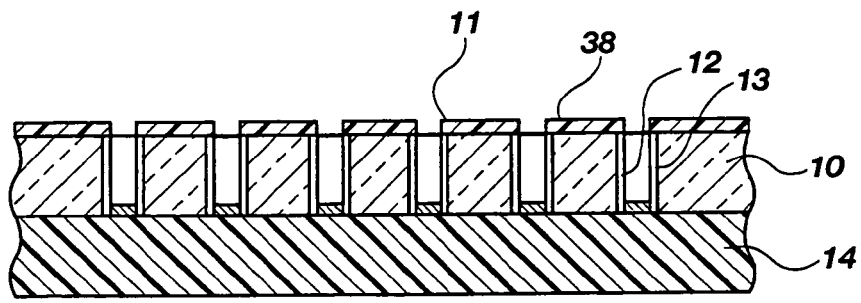
FIG. 6 is a schematic cross-sectional representation of the formation or disposal of an insulative layer over at least the back side of the carrier substrate.

As shown in FIG. 6, a layer 38 comprising insulative material may be formed on back side 11 of carrier substrate 10. Layer 38 may be formed by known processes, such as by growing a thermal oxide (e.g., a silicon oxide) layer on back side 11 and on any other exposed surfaces of carrier substrate 10. A layer 38 comprising a thermally grown oxide may be formed during a furnacing process, such as during a thermal anneal of conductive material 18 (see FIG. 10) to the portions of carrier substrate 10 exposed in apertures 12. Alternatively, a layer 38 of electrically insulative material may be grown by other known processes or deposited onto back side 11 or any other exposed surfaces of carrier substrate 10 by known techniques, such as chemical vapor deposition ("CVD") processes. If the insulative material of layer 38 is deposited, electrically insulative materials such as tetraethylorthosilicate ("TEOS"), silicon nitride, or glass (e.g., borophosphosilicate glass ("BPSG"), phosphosilicate glass ("PSG"), or borosilicate glass ("BSG")) may be employed. As another alternative, layer 38 may be formed from spin-on glass ("SOG"), using known processes.

Layer 38 may be formed on carrier substrate 10 either prior to or after the assembly of carrier substrate 10 and semiconductor device 14. The surfaces of carrier substrate 10 on which layer 38 is present depend, at least in part, on the fabrication method and on whether or not carrier substrate 10 has been assembled with semiconductor device 14.

Carrier substrate 10 may be assembled with semiconductor device 14 either before or after apertures 12 are formed through carrier substrate 10.

Figure 7:
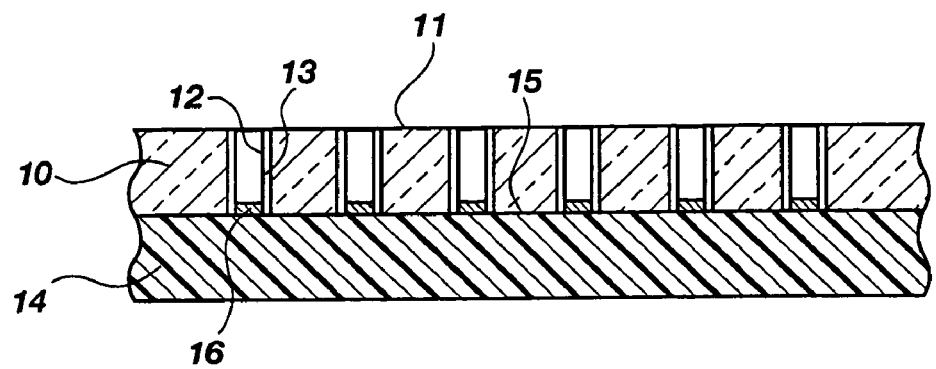
FIG. 7 is a schematic cross-sectional representation of the relative alignment and assembly of the carrier substrate of FIG. 5 with a semiconductor device.

Referring to FIG. 7, carrier substrate 10 may be positioned adjacent to semiconductor device 14 in such a manner that each aperture 12 of carrier substrate 10 and its corresponding bond pad 16 of semiconductor device 14 are substantially aligned. Semiconductor device 14 and carrier substrate 10 preferably have substantially the same, or at least similar, coefficients of thermal expansion so as to maintain the integrity of a chip-scale package 30 (FIGS. 2 and 3) that includes semiconductor device 14 and carrier substrate 10 during operation of semiconductor device 14.

The thicknesses of carrier substrate 10 and semiconductor device 14 may be similar or substantially the same. The thickness of semiconductor device 14 may, however, be greater than that of carrier substrate 10 since semiconductor device 14 includes integrated circuit devices that have been fabricated or built up on active surface 15 thereof.

Figure 8:
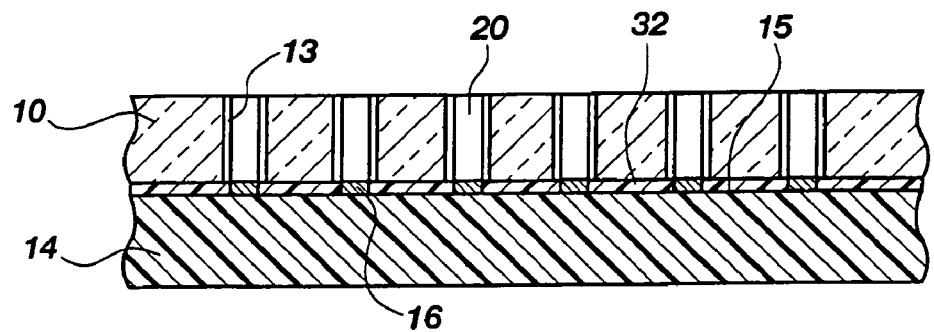
FIG. 8 is a schematic cross-sectional representation of the relative alignment and assembly of the carrier substrate of FIG. 5 with a semiconductor device and a quantity of polymeric or adhesive material disposed between the carrier substrate and the semiconductor device.

As shown in FIG. 8, an intermediate layer 32 may be located between semiconductor device 14 and carrier substrate 10. Intermediate layer 32 may include a polymeric material or an adhesive material, such as a polyimide, that adheres semiconductor device 14 and carrier substrate 10 to one another. Intermediate layer 32 may also insulate structures exposed at active surface 15 of semiconductor device 14 from carrier substrate 10 or structures thereof. Bond pads 16 and vias 20 are preferably exposed through intermediate layer 32 so as to facilitate the communication of signals to and from bond pads 16 through intermediate layer 32 and through vias 20 (see FIG. 3). Intermediate layer 32 may be placed on active surface 15 of semiconductor device 14 or on a surface of carrier substrate 10 by known processes, such as by spin-on techniques or other known processes that may be used to fabricate or form a layer with a substantially planar surface and having a substantially uniform thickness over the surface of a semiconductor device.

Figure 9:
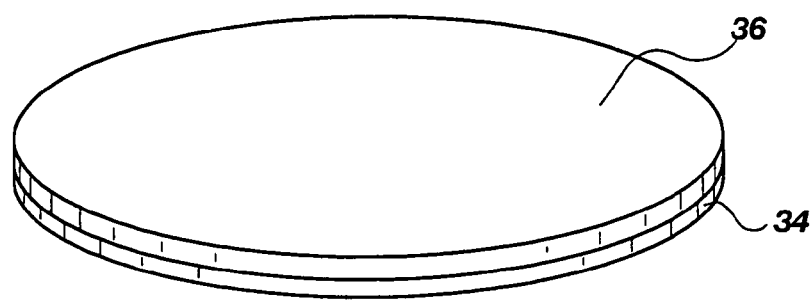
FIG. 9 is a perspective view illustrating the assembly of a wafer including a plurality of semiconductor devices with a substrate wafer.

With reference to FIG. 9, the assembly of carrier substrate 10 and semiconductor device 14 may occur on a wafer scale. Stated another way, a wafer 34 or other large-scale substrate (e.g., a silicon-on-insulator (SOI) type structure, such as silicon-on-ceramic (SOC), silicon-on-glass (SOG), or silicon-on-sapphire (SOS), or a partial wafer of semiconductive material, such as silicon, gallium arsenide, indium phosphide, etc.) including a plurality of semiconductor devices 14 (see FIGS. 7 and 8), which is referred to herein as a semiconductor device wafer, may be assembled with another wafer 36 or other large-scale substrate (e.g., a silicon-on-insulator (SOI) type structure, such as silicon-on-ceramic (SOC), silicon-on-glass (SOG), or silicon-on-sapphire (SOS), or a partial wafer of semiconductive material, such as silicon, gallium arsenide, indium phosphide, etc.), which is referred to herein as a substrate wafer, from which the carrier substrate 10 of each chip-scale package 30 is defined.

If the removal of portions of layer 38 from carrier substrate 10 is desired, known processes, such as mask and etch techniques, may be employed. For example, it may be desirable to remove the insulative material of layer 38 from bond pads 16 or vias 20. Thus, a mask including openings or apertures therethrough which are aligned over areas of layer 38 that are to be removed would be fabricated and used in combination with an etchant that etches the material of insulative layer 38 with selectivity over the conductive material of bond pads 16 or vias 20 or with selectivity over the semiconductor material of carrier substrate 10.

Figure 10:
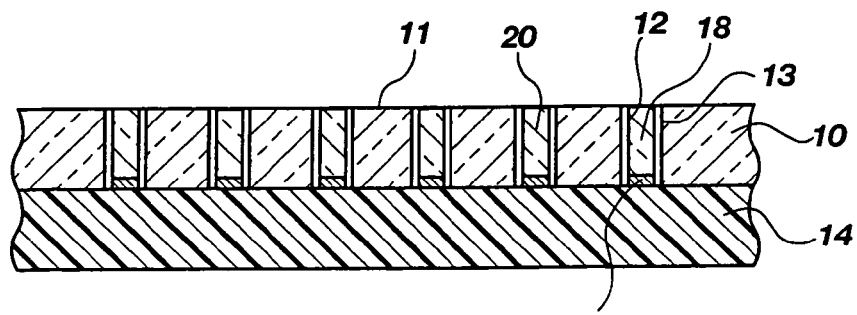
FIG. 10 is a schematic cross-sectional representation of the disposal of conductive material within the apertures of the carrier substrate of FIG. 6 or FIG. 7 to form electrically conductive vias.

Referring to FIG. 10, an assembly including semiconductor device 14 and carrier substrate 10 is shown. Apertures 12, which are lined with a layer 13 of insulative material, are substantially filled with conductive material 18. Conductive material 18 may be disposed in apertures 12 by known processes, such as by known physical vapor deposition ("PVD") processes (e.g., sputtering) or known chemical vapor deposition ("CVD") processes. Any excess conductive material 18 may be removed from back side 11 by known processes, such as by known etching techniques or known planarization processes (e.g., mechanical polishing or chemical-mechanical polishing ("CMP")).

Preferably, as conductive material 18 is disposed in apertures 12, conductive material 18 contacts bond pads 16 of semiconductor device 14. As conductive material 18 may adhere to bond pads 16, or conductive material 18 and the material or materials of bond pads 16 may diffuse, thereby forming a diffusion region or contact between conductive material 18 and the corresponding bond pad 16, the introduction of conductive material 18 within apertures 12 may at least partially secure carrier substrate 10 and semiconductor device 14 to one another.

Figure 11:
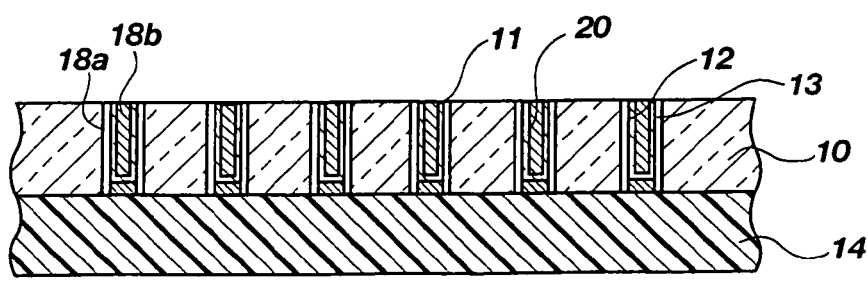
FIG. 11 is a schematic cross-sectional representation of the disposal of two layers of conductive material within the apertures of the carrier substrate of FIG. 6 or FIG. 7 to form electrically conductive vias.

Referring to FIG. 11, it may be desirable to form a via 20 from two layers 18a and 18b of conductive material 18. A first layer 18a includes a barrier-type material that reduces contact resistance. The material of first layer 18a may reduce or prevent diffusion or "spiking" between the semiconductor material of carrier substrate 10 and the primary conductive material of the second layer 18b, which diffusion could cause electrical shorts between adjacent vias 20 or increase the electrical resistance of a via 20. Barrier materials that are known in the art, such as metal silicides, and that are known to be compatible with both the electrically insulative material of layers 13 that line apertures 12 of carrier substrate 10 and the conductive material of second layer 18b may be employed. For example, if the conductive material of second layer 18b comprises titanium, the barrier material of first layer 18a may comprise titanium silicide. Such materials may be deposited by known processes, such as chemical vapor deposition or physical vapor deposition. These materials may either be blanket deposited or selectively deposited, as known in the art.

Of course, the insulative material of layer 13 electrically isolates conductive material 18 of one via 20 from other vias 20 of carrier substrate 10. Conductive material 18 may be annealed to insulative layer 13 by known processes, such as by thermal anneal techniques.

Conductive material 18 (e.g., of either of layers 18a or 18b) that remains on back side 11 or any other regions of carrier substrate 10 where the presence of conductive material is undesirable may be removed by known processes. For example, known planarization techniques, such as chemical-mechanical planarization or chemical-mechanical polishing, may be employed to substantially completely remove the conductive material 18 from back side 11. Alternatively, if the selective removal of any portion of conductive material 18 from back side 11 is desired, known patterning processes, such as mask and etch techniques, may be employed to pattern conductive material 18.

With reference to FIG. 12, conductive traces 22 may be fabricated to reconfigure the footprint of bond pads 16 on active surface 15 of semiconductor device 14 to a different arrangement of contacts 24 on back side 11. Conductive traces 22, therefore, extend substantially laterally from their corresponding vias 20, and may extend substantially internally through carrier substrate 10 or may be carried upon or exposed at back side 11 of carrier substrate 10. Conductive traces 22 may be fabricated by known processes, such as by depositing one or more layers of conductive material onto a surface of carrier substrate 10 and patterning the layer or layers of conductive material. Alternatively, conductive traces 22 may be defined from layer 18 or layers 18a, 18b during patterning of one or more of these layers.

Figure 13:
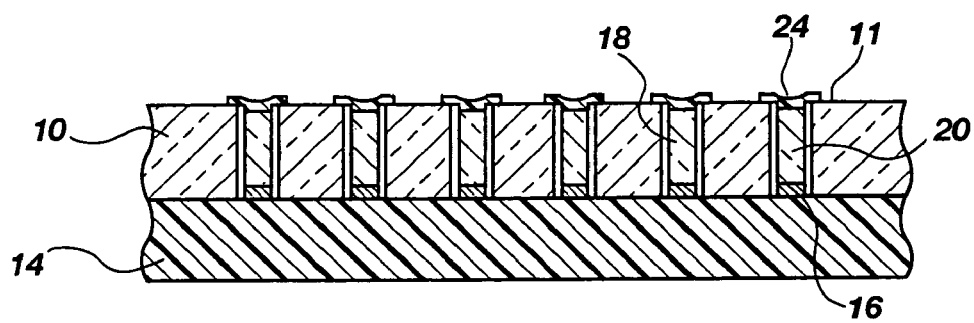
FIG. 13 is a schematic cross-sectional representation of the fabrication of contacts in communication with the electrically conductive vias of FIG. 10.

Referring to FIG. 13 and with continued reference to FIG. 12, contacts 24, which communicate with bond pads 16 by means of vias 20, may be carried upon back side 11 of carrier substrate 10. Contacts 24 are preferably fabricated by known processes (e.g., fabricating the layers by PVD and patterning the layers by mask and etch processes), such as those employed to fabricate under-bump metallurgy or ball-limiting metallurgy structures. Accordingly, each contact 24 may include an adhesion layer adjacent the conductive material 18 of its corresponding via 20, a solder wetting layer adjacent the adhesion layer, and an exposed, substantially nonoxidizable protective layer (e.g., gold or other noble metal) adjacent the solder wetting layer.

Alternatively, if conductive material 18 (or the material of second layer 18b) is a solder-wettable material, contacts 24 may be patterned from the conductive material 18 disposed over back side 11 of carrier substrate 10. Known processes, such as masking and etching, may be employed to define contacts 24 from conductive material 18.

Figure 14:
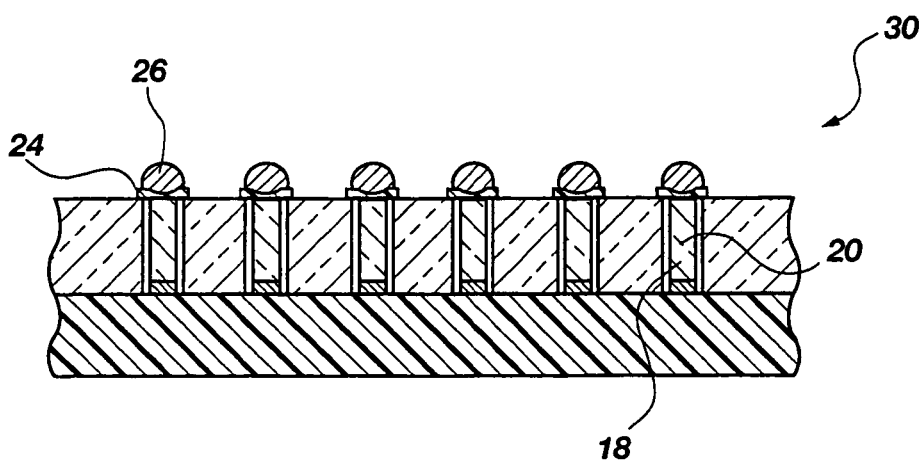
FIG. 14 is a schematic cross-sectional representation of the disposal of conductive structures adjacent the contacts of FIG. 13.

Turning now to FIG. 14, conductive structures 26 may be placed on selected contacts 24. An exemplary material that may be employed to form conductive structures 26 of a chip-scale package 30 incorporating teachings of the present invention is solder. The material of a conductive structure 26 preferably bonds or adheres to an adjacent contact 24 and, thereby, facilitates electrical communication between each conductive structure 26 and its corresponding contact 24. Alternatively, conductive structures 26 may be positioned directly against conductive material 18 of vias 20.

Figure 15:
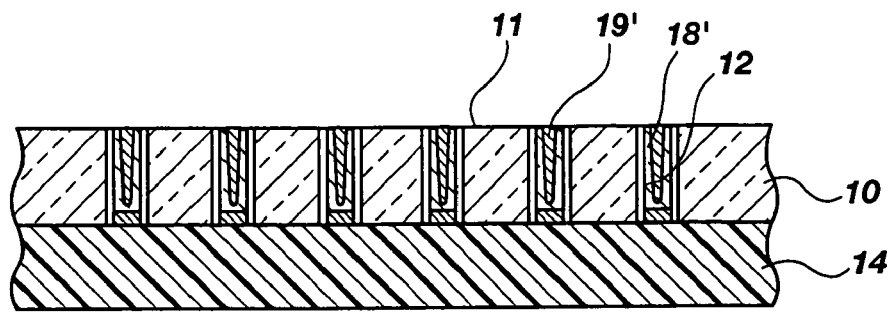
FIG. 15 is a schematic cross-sectional representation of the lining of the apertures of the carrier substrate of FIG. 6 or FIG. 7 with conductive material.

With reference to FIG. 15, as an alternative to substantially filling apertures 12 with conductive material, as is shown in FIGS. 10 and 11, conductive material may be disposed in apertures 12 in one or more relatively thin layers 18', such that hollow or open regions 19' remain in at least some of apertures 12. Preferably, the conductive material of layer 18' is wettable by a conductive bump material, such as molten solder, that is used to form conductive structure 26 of chip-scale package 30. A layer of barrier-type material may be disposed between layer 18' and the adjacent surface of carrier substrate 10 to adhere the conductive material to carrier substrate 10 and to prevent diffusion of the semiconductor material of carrier substrate 10 with layer 18'.

If layer 18' includes a barrier material, the barrier material may be disposed on the insulative layer 13—lined surfaces of apertures 12 by known processes, such as by chemical vapor deposition or physical vapor deposition. The wettable conductive material of layer 18' may also be disposed over the insulative layer 13—lined surface of each aperture 12 by known processes, such as chemical vapor deposition or physical vapor deposition. Excess barrier material or conductive material may be removed from back side 11 of carrier substrate 10 or other undesired regions thereof by known processes, such as by known patterning or planarization techniques.

Figure 16:
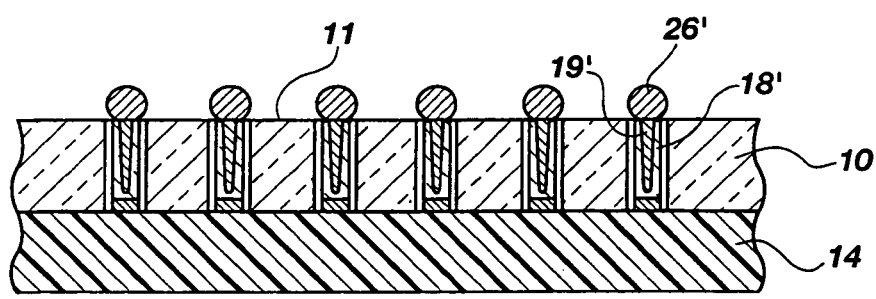
FIGS. 16 and 17 are schematic cross-sectional representations of the disposal of conductive structures within the lined apertures of the carrier substrate of FIG. 11.
Figure 17:
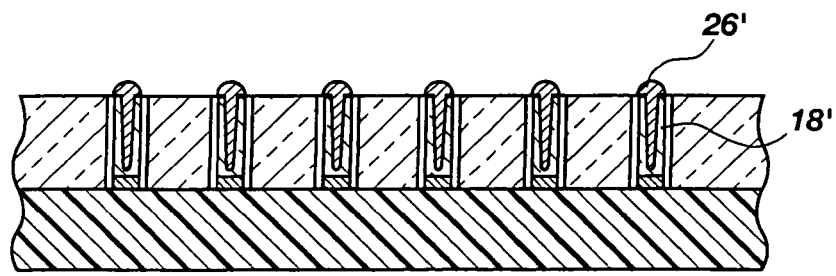

As shown in FIGS. 16 and 17, a conductive structure 26' material, such as solder, may be disposed adjacent conductive layer 18'. If layer 18' includes a material that is wettable by the conductive material employed, the conductive bump may be drawn into hollow region 19' by capillary action, or "wicking."

Figure 18:
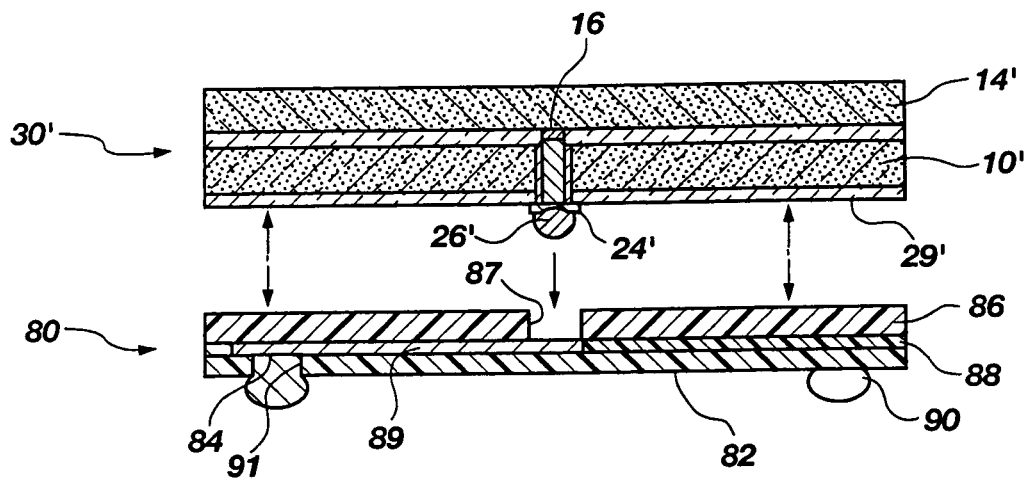
FIG. 18 is a cross-sectional representation of a chip-scale package, such as that shown in FIG. 4, being assembled with another interposer to change the footprint of contact pads of the chip-scale package.

With reference to FIG. 18, the chip-scale package 30' depicted in FIG. 4, which includes a carrier substrate 10' with contacts 24' that are arranged substantially linearly along a central location thereof, or any other type of semiconductor device, may be assembled with another substrate 80 that includes contacts 84 that are arranged to have a different "footprint" than that of contacts 24'. As depicted, contacts 84 are arranged in an array over a surface 82 of substrate 80.

As shown, substrate 80 includes a first layer 86 that is configured to be positioned adjacent an exposed surface 29' of chip-scale package 30', a conductive, second layer 88 including laterally extending electrically conductive traces 89, and a third layer 90 located adjacent second layer 88, opposite first layer 86.

First layer 86 is preferably a thin film which may be formed from an electrically insulative material, such as a polyimide, glass, or ceramic, or from a semiconductive material with at least some surfaces thereof being coated with insulative material. First layer 86 includes apertures 87 formed therethrough. When substrate 80 is disposed on surface 29' of chip-scale package 30', each aperture 87 aligns with and receives a portion of a corresponding conductive structure 26' that protrudes from chip-scale package 30'.

Second layer 88 includes distinct, electrically isolated conductive traces 89. Each conductive trace 89 of second layer 88 corresponds to a conductive structure 26' of chip-scale package 30'. Each conductive trace 89 extends laterally from aperture 87 formed through first layer 86 at least to a desired lateral position for a contact 84. Thus, each conductive trace 89 reroutes the position of a bond pad 16 of a semiconductor device 14' of chip-scale package 30', as well as a position of a contact 24' of chip-scale package 30'.

Third layer 90 provides electrical insulation over conductive traces 89 and includes apertures 91 formed therethrough, through which the portions of each conductive trace 89 that form contacts 84 are exposed. By way of example only, third layer 90 may be formed from a polyimide or other electrically insulative resin, from another electrically insulative material, such as glass or ceramic, or from a semiconductive material with at least some surfaces thereof being lined with an electrically insulative material.

Preferably, the materials from which substrate 80 is formed have substantially the same, or at least similar, coefficients of thermal expansion as those of the materials from which semiconductor device 14' and carrier substrate 10' of chip-scale package 30' are formed.

Figure 19:
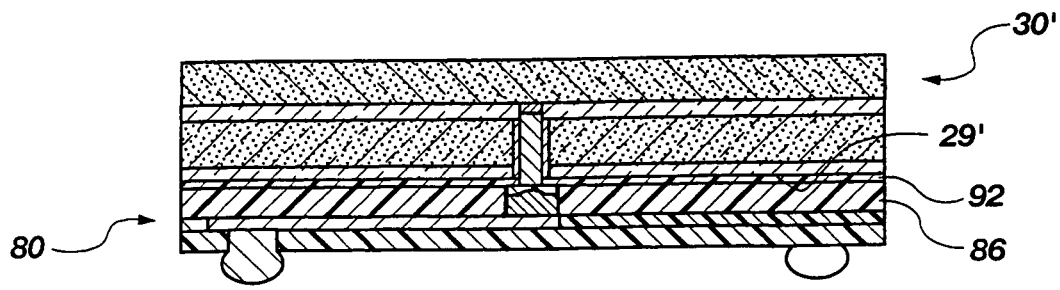
FIG. 19 is a cross-sectional view of the completed assembly of the chip-scale package of FIG. 18 with the additional interposer also depicted in FIG. 18.

Substrate 80 may be fabricated on chip-scale package 30' or separately therefrom and subsequently assembled with chip-scale package 30'. As illustrated in FIG. 19, a quantity of adhesive material or underfill material 92 may be introduced between surface 29' of chip-scale package 30' and first layer 86 of substrate 80, securing the separately fabricated substrate 80 to chip-scale package 30'.

In either event, known processes may be used to fabricate substrate 80. For example, first layer 86 may be formed by known processes for forming a thin film from an electrically insulative resin, such as a polyimide. If a photoimageable resin is used, apertures 87 may be formed by selectively curing all of the areas of a layer of the photoimageable resin but those in which apertures 87 are to be located. If first layer 86 is formed and cured or otherwise solidified prior to the formation of apertures 87, apertures 87 may be formed in first layer 86 by known processes, such as by use of known laser drilling techniques or mask and etch processes.

The conductive traces 89 of second layer 88 may also be formed by known processes. For example, conductive traces 89 may be preformed, then positioned at appropriate locations on first layer 86. Alternatively, conductive traces 89 may be formed by depositing a layer of conductive material onto a surface of first layer 86, as known in the art (e.g., by PVD or CVD), then patterning the layer of conductive material, as also known in the art (e.g., by mask and etch processes).

Third layer 90 may be formed over conductive traces 89 by known processes. If, for example, third layer 90 is formed from polyimide or another resin, the material may be applied to conductive traces 89 and the areas of first layer 86 that are exposed between conductive traces 89 by known techniques, such as spin coating or spray coating. Apertures 91 may be formed through third layer 90 by selective exposure, if third layer 90 is formed from a photoimageable material, while the material of third layer 90 is being cured, or following the hardening of third layer 90 by other known techniques, such as laser drilling or the use of a mask and a suitable etchant.

As another alternative, a tape-automated bonding-type tape may be used to form conductive traces 89 and one of first layer 86 and third layer 90. Apertures 87, 91 may be formed in the film portion of the TAB tape by known processes, such as by use of laser drilling techniques or mask and etch processes. The other layers 86, 90 and the apertures 87, 91 that extend therethrough may then be formed by the processes disclosed herein.

As chip-scale packages 30 incorporating teachings of the present invention may be fabricated on a wafer-scale, as depicted in FIG. 9, testing, probing, or burn-in of each of semiconductor device 14 of semiconductor device wafer 34 can be performed after packaging, but prior to severing or singulating semiconductor devices 14 from semiconductor device wafer 34. Thus, the packaging method of the present invention eliminates the need to individually align separate semiconductor device packages with the probes or contacts of test equipment.

When semiconductor devices 14 of chip-scale packages 30 are tested, probed, or burned-in, semiconductor devices 14 and their corresponding carrier substrates 10 may be subjected to increased temperatures. Consequently, thermal mismatches between (i.e., different coefficients of thermal expansion ("CTEs") of) semiconductor devices 14 and their corresponding carrier substrates 10 may cause mechanical stresses to be induced on one or both of semiconductor device wafer 34 and substrate wafer 36. These potential mechanical stresses may be reduced following the assembly of semiconductor device wafer 34 and substrate wafer 36, before or after the introduction of conductive material 18 into apertures 12 (FIGS. 10, 11, and 15) or before or after the fabrication of conductive traces 22 or contacts 24 by substantially severing one of semiconductor device wafer 34 and substrate wafer 36 at locations between adjacent semiconductor devices 14 and chip-scale packages 30.

Figure 20:
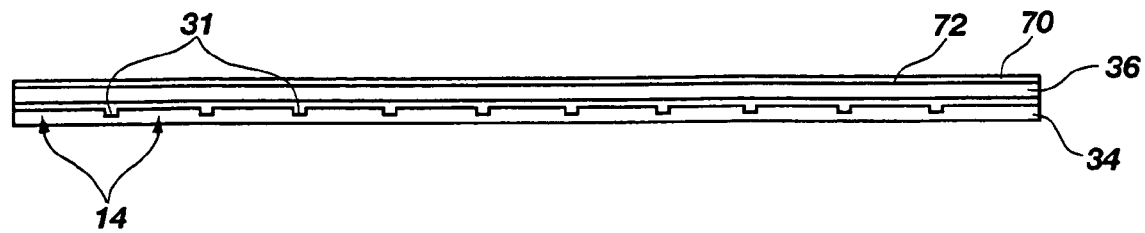
FIGS. 20-22 schematically depict an exemplary laser ablation method for removing material between adjacent interposers formed by a substrate wafer after the substrate wafer has been assembled with a semiconductor device wafer that includes a plurality of semiconductor devices.
Figure 21:
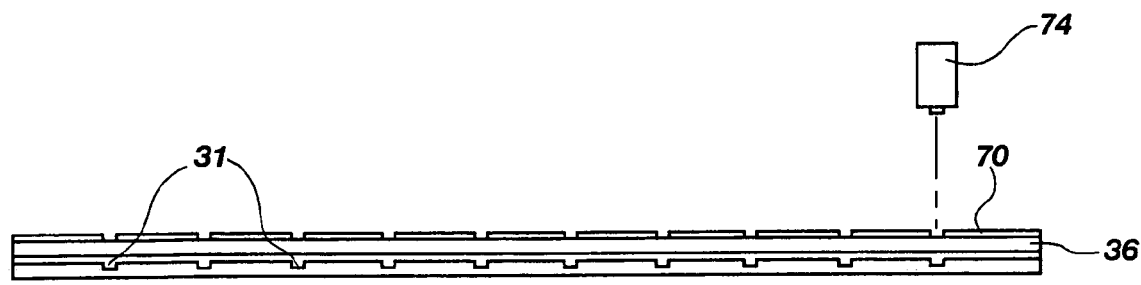
Figure 22:
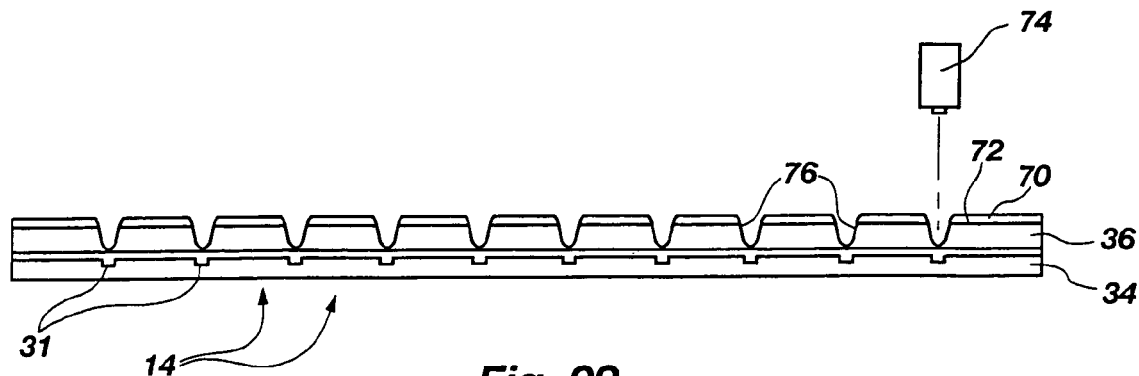

FIGS. 20-22 depict an exemplary, energy (e.g., laser) ablation method for reducing the thickness of one or both of semiconductor device wafer 34 and substrate wafer 36 prior to testing, probing, or burning in of the semiconductor devices 14 of semiconductor device wafer 34 and before chip-scale packages 30 are physically separated from one another. As depicted, the thickness of at least substrate wafer 36 may be reduced at locations that overlie streets 31 of semiconductor device wafer 34, which are located between adjacent semiconductor devices 14 of semiconductor device wafer 34.

As shown in FIG. 20, a layer 70 of protective material may be disposed onto an exposed surface 72 of substrate wafer 36, located opposite semiconductor device wafer 34. The protective material of layer 70 is preferably substantially opaque to the wavelengths of electromagnetic radiation, or laser light, that will be used to reduce the thickness of substrate wafer 36 at locations that overlie streets 31 of semiconductor device wafer 34. As an example, a layer 70 of opaque polyimide may be applied to surface 72 by spin coating or spray coating, then permitted to solidify by evaporation of solvent therefrom. Alternatively, an opaque, photoimageable or thermosetting-type material may be applied to surface 72 and cured by use of appropriate techniques. As another example, layer 70 may comprise a metal oxide of low reflectivity and that is substantially opaque to the wavelength or wavelengths of radiation emitted from a laser 74 (FIGS. 21 and 22) or other, suitable energy beam source that will be used to remove material of substrate wafer 36. A layer 70 including such a metal oxide may be formed by known processes, such as by chemical vapor deposition. A layer 70 comprising a metal oxide may also be formed by first depositing the metal (by PVD or CVD), then oxidizing the metal (e.g., by exposing the metal to an increased temperature in an oxygen-rich atmosphere).

As shown in FIG. 21, the protective material of layer 70 may be removed by the same laser 74 or other suitable energy beam that will subsequently be used to remove material of substrate wafer 36 from locations that overlie streets 31. Alternatively, known mask and etch processes may be used to remove protective material from the regions of layer 70 that overlie streets.

Next, as shown in FIG. 22, the portions of substrate wafer 36 that are exposed through layer 70 are irradiated with electromagnetic radiation from laser 74, which may comprise a carbon dioxide laser, an Nd:YAG laser, an Nd:YLF laser, any other type of laser suitable for use in cutting or removing silicon, or any other suitable source of energy or electromagnetic radiation that may be used to cut or remove silicon. Upon irradiating the exposed regions of substrate wafer 36, material is removed from locations of substrate wafer 36 that overlie streets 31, thereby forming scribe lines in or "cutting" substrate wafer 36 at these locations. Layer 70 may prevent the circuitry and other components of semiconductor devices 14 from being exposed to scattered radiation of the wavelength or wavelengths that are emitted by laser 74, thereby preventing laser-induced damage to semiconductor devices 14 during reduction of the thickness of substrate wafer 36 and the consequent formation of trenches 76 at the desired locations.

Once the thicknesses of the portions of substrate wafer 36 that overlie streets 31 of semiconductor device wafer 34 have been reduced, as desired, layer 70 may be substantially removed from surface 72 of substrate wafer 36. A suitable removal process depends upon the type of protective material from which layer 70 is formed. For example, if an opaque polyimide, photoimageable material or other resin or epoxy is used, a solution including a suitable solvent for these materials may be used to substantially remove layer 70 from surface 72. If, in the alternative, layer 70 is formed from a metal oxide that is opaque to the wavelength or wavelengths of radiation that are emitted by laser 74, a suitable wet or dry etchant may be used to substantially remove layer 70 from surface 72.

As another alternative, known semiconductor device structure patterning processes (e.g., masking and etching techniques) may be used to reduce a thickness of substrate wafer 36 at positions that are located over streets 31 of semiconductor device wafer 34.

Figure 23:
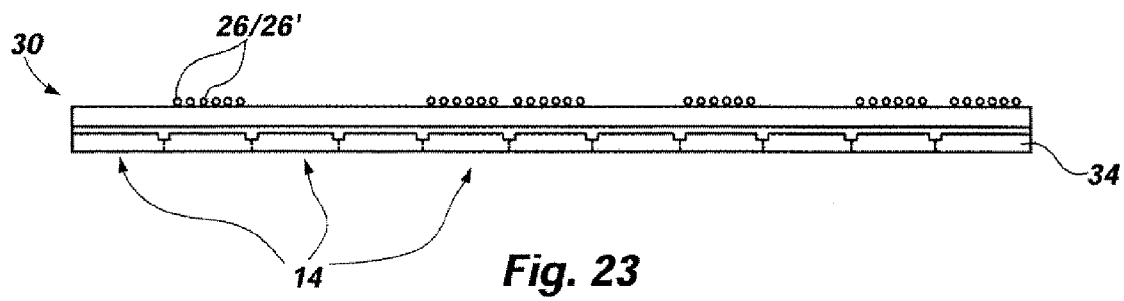
FIG. 23 schematically illustrates the selective attachment of conductive structures to operable chip-scale packages of the present invention.
Figure 24:
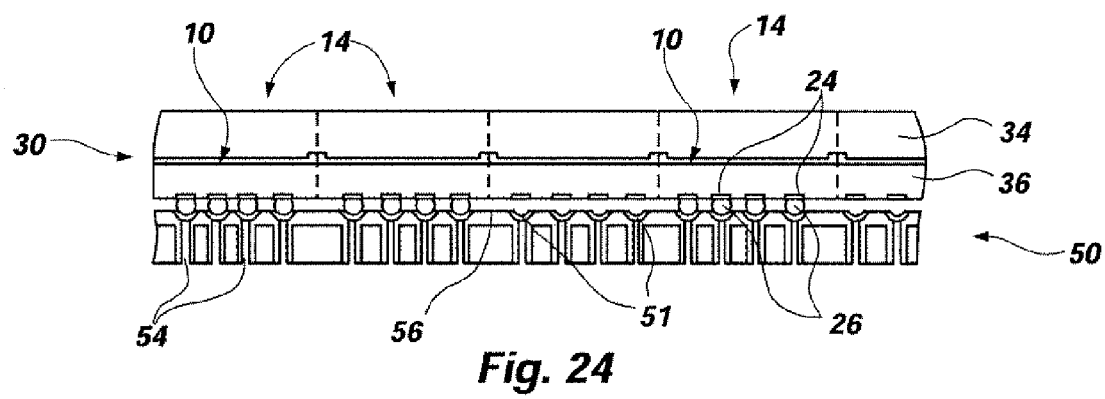
FIG. 24 is a cross-sectional representation of an assembly of physically connected chip-scale packages of the present invention with a test chuck incorporating teachings of the present invention.

FIGS. 23 and 24 depict an exemplary manner in which semiconductor devices 14 of chip-scale packages 30 may be tested, probed, or burned-in prior to singulation thereof from semiconductor device wafer 34 or another large-scale substrate.

As shown in FIG. 23, each semiconductor device 14 of a semiconductor device wafer 34 or other large-scale substrate may be probed, as known in the art, to evaluate the electrical properties of that semiconductor device 14 and to thereby determine whether or not that semiconductor device 14 is functional. In addition, the location of each functional semiconductor device 14 on semiconductor device wafer 34 or another large-scale substrate may be mapped using known techniques.

If probing is effected before conductive structures 26 are placed on contacts 24 (FIG. 14) or adjacent to layers 18' of conductive material (FIGS. 16 and 17), once the functional semiconductor devices 14 fabricated on semiconductor device wafer 34 have been identified and mapped, conductive structures 26 may be placed on contacts 24 or adjacent to layers 18' of each carrier substrate 10 that is positioned adjacent to a functional semiconductor device 14, as described previously herein with reference to FIGS. 14, 16, and 17. Preferably, conductive structures 26, 26' are not applied to contacts 24 or layers 18' of nonfunctional semiconductor device 14. Alternatively, conductive structures 26, 26' may be applied to each contact 24 or layer 18' of both the functional and nonfunctional semiconductor device 14 on semiconductor device wafer 34 or another large-scale substrate.

Figure 25:
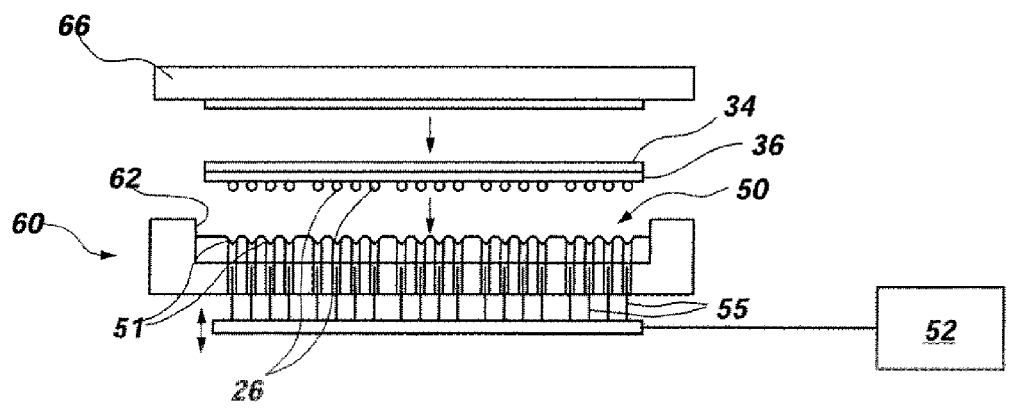
FIG. 25 is a schematic representation showing the test chuck of FIG. 24 being assembled with an exemplary test apparatus.

Turning now to FIG. 24, in testing, probing, or burning-in semiconductor devices 14, the assembly of substrate wafer 36 and semiconductor device wafer 34 or another large-scale substrate upon which semiconductor devices 14 are carried is oriented within a test chuck 50, which, in turn, is associated with a tester 52 (FIG. 25). As shown, conductive structures 26 protruding from contacts 24 of functional semiconductor devices 14 are disposed adjacent to and in electrical contact with corresponding test terminals 51 of test chuck 50. Test terminals 51 of test chuck 50 facilitate communication between each functional semiconductor device 14 and tester 52 so that semiconductor devices 14 may be tested, probed, or burned-in in the desired manner.

The exemplary test chuck 50 illustrated in FIG. 24 is a substantially planar member that includes an aperture 54 beneath each test terminal 51 so as to facilitate the insertion of probes 55 (FIG. 25) that communicate with tester 52 (FIG. 25) therethrough and into electrical contact with test terminals 51 while semiconductor devices 14 are being tested, probed, or burned-in. Preferably, apertures 54 and areas on a surface 56 of test chuck 50 that laterally surround test terminals 51 are lined with an electrically insulative material so as to prevent shorting of various electrical circuits that are formed during testing, probing, or burning-in of semiconductor devices 14.

Test chuck 50 preferably includes a bulk silicon or another substrate that has a coefficient of thermal expansion that is similar to the CTEs of substrate wafer 36 and of semiconductor device wafer 34 or another large-scale substrate upon which semiconductor devices 14 are fabricated. When the coefficients of thermal expansion of test chuck 50, substrate wafer 36, and semiconductor device wafer 34 or another large-scale substrate that carries semiconductor devices 14 are substantially the same or similar, the likelihood is reduced that conductive structures 26, carrier substrates 10, and semiconductor devices 14 will be damaged during testing, probing, or burning-in of semiconductor devices 14.

Of course, known, suitable semiconductor device fabrication techniques, including, without limitation, material deposition, oxide formation, and patterning processes, may be used to fabricate test chuck 50.

Test chuck 50 may be used, as known in the art, in known, test, probe, or burn-in equipment to facilitate the testing, probing, or burning-in of a collection of chip-scale packages 30 incorporating teachings of the present invention.

As illustrated in FIG. 25 a test chuck 50 may be positioned in an appropriate location within a receptacle 62 of a testing apparatus 60, such that test terminals 51 are located in positions that facilitate the communication of corresponding probes 55 therewith. An assembly including semiconductor device wafer 34 and substrate wafer 36 is invertedly oriented over test chuck 50, with conductive structures 26 being aligned with corresponding test terminals 51 of test chuck 50. Preferably, test terminals 51 partially receive their corresponding conductive structures 26 so as to facilitate the formation of an adequate electrical connection between each test terminal 51 and its corresponding conductive structure 26. The assembly of semiconductor device wafer 34 and substrate wafer 36 may be biased toward test chuck 50 so as to further ensure the formation of adequate electrical connections between conductive structures 26 and their corresponding test terminals 51. For example, a lid 66 that is configured to be coupled with testing apparatus 60 may be positioned over the assembly of semiconductor device wafer 34 and substrate wafer 36 and secured to testing apparatus 60 in such a manner that lid 66 biases the assembly of semiconductor device wafer 34 and substrate wafer 36 to test chuck 50.

Each chip-scale package 30 in the assembly of semiconductor device wafer 34 and substrate wafer 36 may then be tested, probed, or burned-in, as known in the art, by use of a suitable tester 52 or other equipment associated with testing apparatus 60.

Figure 26:
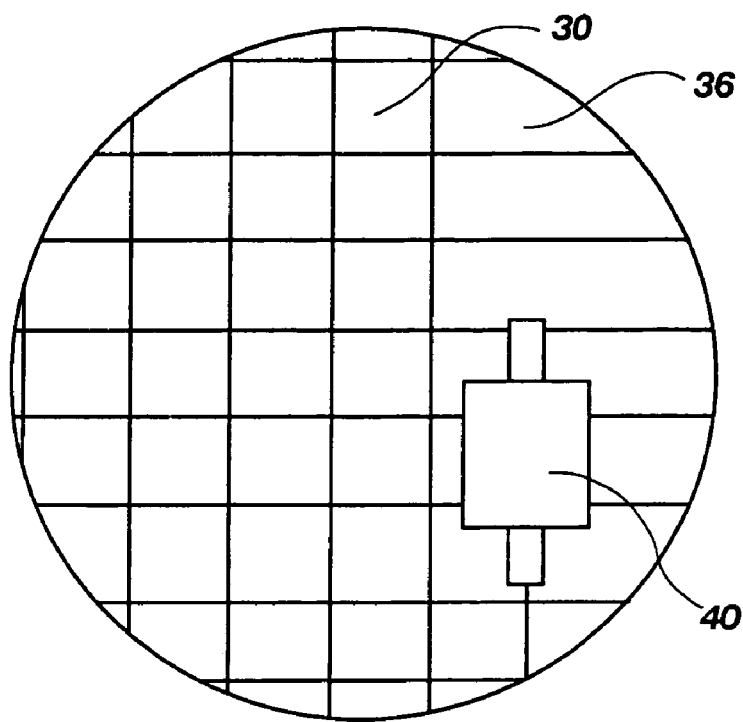
FIG. 26 is a schematic representation of the singulation of chip-scale packages from an assembled semiconductor device wafer and substrate wafer.

Turning now to FIG. 26, individual chip-scale packages 30 may be singulated from the assembly of semiconductor device wafer 34 (not shown) and substrate wafer 36 by known singulation processes, such as by the use of a wafer saw 40. If trenches 76 have been formed in substrate wafer 36, as shown in FIGS. 20-22, substrate wafer 36 and semiconductor device wafer 34 may be singulated along trenches 76. Trenches 76 may also be used to ensure that the blade or blades of wafer saw 40 are properly aligned over the streets 31 located between the semiconductor devices 14 that have been fabricated on semiconductor device wafer 34.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning of the claims are to be embraced thereby.

What is claimed is:

1. A semiconductor device assembly, comprising:
   a first large-scale substrate comprising a plurality of semiconductor devices formed thereon, each semiconductor device of the plurality of semiconductor devices including at least one bond pad on an active surface thereof;
   a second large-scale substrate positioned adjacent the first large-scale substrate and including a plurality of interposers, boundaries between interposers of the plurality of interposers having a reduced thickness relative to the interposers, each interposer of the plurality of interposers corresponding to a semiconductor device of the plurality of semiconductor devices and including at least one aperture formed therethrough, the at least one aperture aligned over the at least one bond pad of the corresponding semiconductor device; and
   conductive material located within at least a portion of the at least one aperture, the conductive material extending substantially along a length of the at least one aperture and being bonded to the at least one bond pad.

2. The semiconductor device assembly of claim 1, wherein the first large-scale substrate comprises a wafer of semiconductor material.

3. The semiconductor device assembly of claim 1, wherein the second large-scale substrate comprises a wafer of semiconductor material.

4. The semiconductor device assembly of claim 1, wherein the second large-scale substrate includes thin regions between adjacent interposers of the plurality of interposers.

5. The semiconductor device assembly of claim 4, wherein the thin regions extend substantially through the second large-scale substrate.

6. The semiconductor device assembly of claim 1, wherein each interposer includes at least one contact pad positioned over the at least one aperture in communication with the conductive material within at least the portion of the at least one aperture.

7. The semiconductor device assembly of claim 1, further comprising an electrically insulative material disposed between the first large-scale substrate and the second large-scale substrate.

8. The semiconductor device assembly of claim 1, including a hollow area within the conductive material within the at least one aperture of each interposer.

9. The semiconductor device assembly of claim 1, further comprising at least one conductive structure protruding from each interposer on an opposite side thereof from the corresponding semiconductor device and communicating with the at least one bond pad of the corresponding semiconductor device.

10. The semiconductor device assembly of claim 1, wherein at least some interposers of the plurality of interposers include laterally extending conductive traces communicating with the conductive material in at least the portion of the at least one aperture thereof.

11. The semiconductor device assembly of claim 1, further comprising an additional interposer layer positioned adjacent each interposer of the plurality of interposers, on an opposite side of the plurality of interposers from the corresponding semiconductor device, the additional interposer layer including a laterally extending conductive trace and at least one contact pad, the at least one contact pad having a different lateral position relative to a plane of the corresponding semiconductor device than the at least one bond pad of the corresponding semiconductor device.

12. The semiconductor device assembly of claim 11, wherein the additional interposer layer comprises a material having substantially the same coefficient of thermal expansion as a material of the first and second large-scale substrates.

13. The semiconductor device assembly of claim 12, wherein the additional interposer layer comprises a semiconductor material.

14. The semiconductor device assembly of claim 11, wherein the additional interposer layer comprises polyimide.

* * * * *